(12) United States Patent
Fukuda

(10) Patent No.: US 10,849,247 B2
(45) Date of Patent: Nov. 24, 2020

(54) VEHICLE-MOUNTED ELECTRONIC DEVICE INCLUDING A SUBSTRATE INSIDE A HOUSING

(71) Applicant: Mitsubishi Electric Corporation, Tokyo (JP)

(72) Inventor: Akiharu Fukuda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/335,120

(22) PCT Filed: Oct. 24, 2016

(86) PCT No.: PCT/JP2016/081432
§ 371 (c)(1),
(2) Date: Mar. 20, 2019

(87) PCT Pub. No.: WO2018/078690
PCT Pub. Date: May 3, 2018

(65) Prior Publication Data
US 2020/0015379 A1    Jan. 9, 2020

(51) Int. Cl.
*H05K 7/14*     (2006.01)
*H05K 5/03*     (2006.01)
*H05K 5/00*     (2006.01)

(52) U.S. Cl.
CPC .......... *H05K 7/14* (2013.01); *H05K 5/03* (2013.01); *H05K 5/0026* (2013.01); *H05K 5/0052* (2013.01)

(58) Field of Classification Search
CPC .. H05K 5/0039; H05K 7/1405; H05K 7/1418; H05K 5/0026; H05K 5/0052; H05K 5/03; H05K 7/14
See application file for complete search history.

(56) References Cited

U.S. PATENT DOCUMENTS 7,410,369 B2 *  8/2008  Busse ............... H01R 29/00
                                                    439/76.1
2003/0086250 A1  5/2003  Wortman et al.
(Continued)

FOREIGN PATENT DOCUMENTS

CN      2513321 Y      9/2002
CN    101730407 A      6/2010
(Continued)

OTHER PUBLICATIONS

Chinese Office Action and Search Report dated Mar. 18, 2020, for corresponding Chinese Patent Application No. 201680090256.3, with partial translation.
(Continued)

*Primary Examiner* — James Wu
(74) *Attorney, Agent, or Firm* — Birch, Stewart, Kolasch & Birch, LLP

(57) ABSTRACT

A box (4) has, on a rear wall surface (4b) facing a plane where an opening (4a) is formed, a first protrusion (4g) which is fitted to a first notch (3a) of a substrate (3) and first ribs (4h) which support a first end of the substrate (3) by sandwiching the first end, and has, on two surfaces facing respective substrate surfaces of the substrate (3), a hole (4n) for each of the two surfaces. A lid (5) has, on a lid surface (5a) facing the opening (4a), a second protrusion (5b) fitted to a second notch (3b) of the substrate (3), a second rib (5c), and a third rib (5d), the second and third ribs supporting a second end of the substrate (3) by sandwiching the second end, and has, at an outer periphery, hooks (5g) for fixing the lid (5) to the box (4) by being fitted to the holes (4n) of the box (4). The hooks (5g) each have an inclined surface (5j) that allows the lid (5) to move by a specified amount in a direction in which the lid (5) comes off from the box (4).

4 Claims, 5 Drawing Sheets

(56) References Cited

U.S. PATENT DOCUMENTS

| | | |
|---|---|---|
| 2010/0089604 A1 | 4/2010 | Tang |
| 2013/0329441 A1 | 12/2013 | Ishikawa |
| 2016/0095233 A1* | 3/2016 | Kusumi ............... H05K 7/1405 |
| | | 361/756 |
| 2017/0257959 A1* | 9/2017 | Ogitani ................ H01R 12/716 |

FOREIGN PATENT DOCUMENTS

| | | |
|---|---|---|
| EP | 0511014 A1 | 10/1992 |
| JP | 4-18478 U | 2/1992 |
| JP | 9-74291 A | 3/1997 |
| JP | 2000-49475 A | 2/2000 |
| JP | 2010-287790 A | 12/2010 |
| JP | 2012-119621 A | 6/2012 |
| JP | 2013-73985 A | 4/2013 |

OTHER PUBLICATIONS

German Office Action for German Application No. 112016007210.4, dated Feb. 12, 2020, with English machine translation.
Chinese Office Action and Search Report for Chinese Application No. 201680090256.3, dated Sep. 23, 2020.

* cited by examiner

VEHICLE-MOUNTED ELECTRONIC DEVICE INCLUDING A SUBSTRATE INSIDE A HOUSING

TECHNICAL FIELD

The present invention relates to a vehicle-mounted electronic device including a substrate inside a housing.

BACKGROUND ART

In the related art, vehicle-mounted electronic devices including a substrate employ a structure for holding a substrate in an inner space of a housing formed by a box formed into a box shape having at least one surface as an open surface and a lid closing the open surface of the box.

For example, in a structure for holding a substrate described in Patent Literature 1, a first engagement part and a second engagement part which are inclined symmetrically with respect to an insertion direction of the substrate are provided in a front end part of the substrate in the insertion direction. In addition, a first locking part having, on a surface extending in a thickness direction of the substrate and inclined in the same direction as the first engagement part, a plurality of projections separated in the thickness direction and a second locking part having, on a surface inclined in the same direction as the second engagement part, a plurality of projections separated in the thickness direction are provided in a deep part of a housing. When the substrate is inserted into the housing, the first engagement part is engaged with the first locking part, and the second engagement part is engaged with the second locking part to hold the front end part of the substrate in the insertion direction. As a result, positioning and holding of the substrate are performed at the center of the substrate, and thus a clearance area provided between the substrate and the housing is suppressed, thereby suppressing occurrence of rattling.

CITATION LIST

Patent Literature

Patent Literature 1: JP 2013-73985 A

SUMMARY OF INVENTION

Technical Problem

In vehicle-mounted electronic devices having a structure for holding a substrate, in the case where the substrate and a housing have different linear expansion coefficients, a temperature change results in a difference in the shrinkage factor between the substrate and the housing. In the case where the housing shrinks more than the substrate does, it is necessary to, for example, suppress occurrence of a crack in the housing or to prevent a member such as a lid from coming off from the housing by being pushed by the substrate.

In the structure for holding the substrate of Patent Literature 1 described above, since the clearance is provided between an edge of the substrate and the housing, a difference in the shrinkage factor due to a temperature change in a direction perpendicular to the insertion direction of the substrate can be absorbed. On the other hand, in the insertion direction of the substrate, there is no clearance capable of absorbing a difference in the shrinkage factor due to a temperature change, and thus there is a problem in which, for example, a crack is generated in the housing or a member such as a lid comes off from the housing.

The present invention has been devised in order to solve the above-mentioned problem, and it is an object of the present invention, in the case where a substrate and a housing have different linear expansion coefficients, to absorb a difference in the shrinkage factor upon temperature change and to suppress occurrence of a crack in the housing or to prevent a member such as a lid from coming off from the housing.

Solution to Problem

A vehicle-mounted electronic device according to the present invention and of the present invention includes: a housing formed of a resin material; and a substrate formed of a material having a linear expansion coefficient smaller than that of the resin material, the substrate accommodated in the housing, in which the substrate has a first notch and a second notch at respective centers of two sides of the substrate, the two sides facing each other, the housing includes a box having an opening and a lid covering the opening, the box has, on a rear wall surface facing a plane where the opening is formed, a first protrusion which is fitted to the first notch and first ribs which support a first end of the substrate by sandwiching the first end, and has, on two surfaces facing respective substrate surfaces of the substrate, a hole for each of the two surfaces, the lid has, on a lid surface facing the opening, a second protrusion fitted to the second notch, a second rib, and a third rib, the second and third ribs supporting a second end of the substrate by sandwiching the second end, and has, at an outer periphery of the lid, hooks each of which fixes the lid to the box by being fitted to the corresponding hole of the box, and the hooks each have an inclined surface that allows the lid to move by a specified amount in a direction in which the lid comes off from the box.

Advantageous Effects of Invention

According to the present invention, even in the case where linear expansion coefficients of a substrate and a housing are different, it is possible to absorb a difference in the shrinkage factor upon temperature change and to suppress occurrence of a crack in the housing or to prevent a member such as a lid from coming off from the housing.

DESCRIPTION OF EMBODIMENTS

To describe the present invention further in detail, an embodiment for carrying out the present invention will be described below with reference to the accompanying drawings.

First Embodiment

Figure 1:
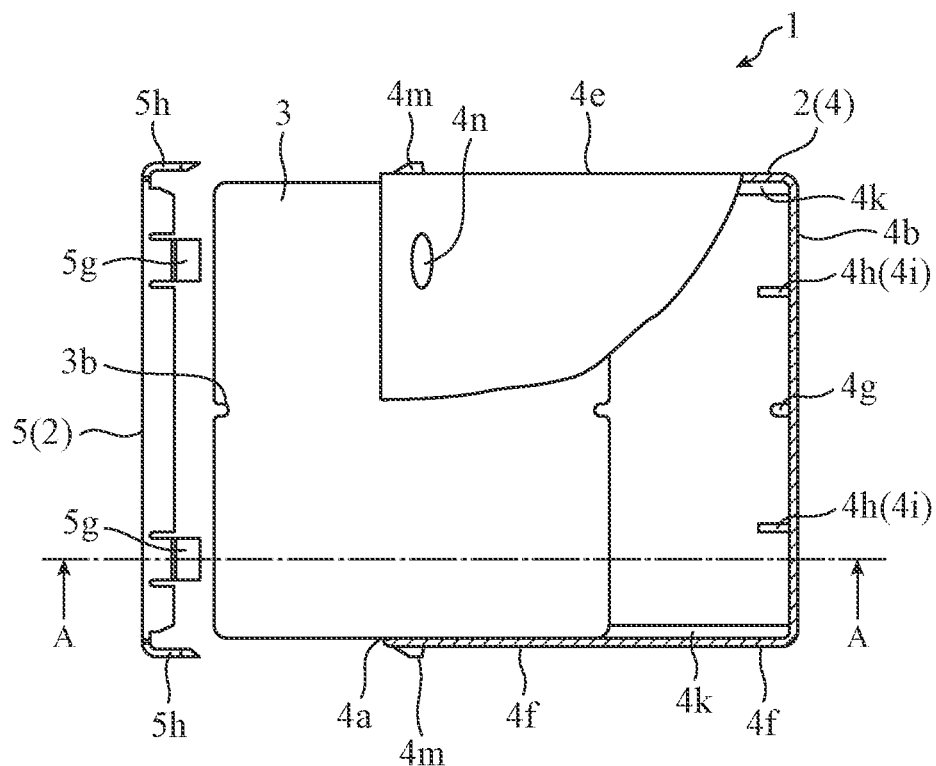
FIG. 1 is an exploded cross-sectional view of a main part schematically illustrating a configuration of a vehicle-mounted electronic device according to a first embodiment.

FIG. 1 is an exploded cross-sectional view of a main part schematically illustrating a configuration of a vehicle-mounted electronic device according to a first embodiment. In FIG. 1, illustration of a part of a top surface of a housing which will be described later is omitted.

Figure 2:
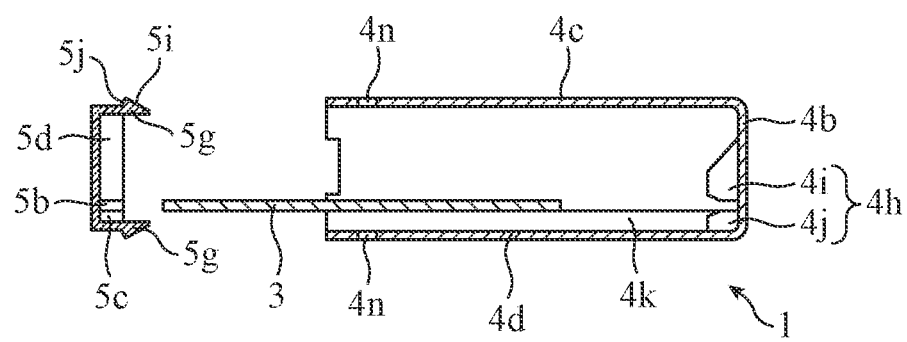
FIG. 2 is a cross-sectional view taken along line A-A in FIG. 1.

FIG. 2 is a cross-sectional view taken along line A-A in FIG. 1. In FIG. 2, the top surface of the housing not illustrated in FIG. 1 is included in the illustration.

A vehicle-mounted electronic device 1 includes a housing 2 made of a resin material and a substrate 3 made of a material having a linear expansion coefficient smaller than that of the housing 2. The housing 2 is formed from, for example, an ABS resin, a PBT resin, or the like. The substrate 3 is formed from, for example, glass or the like. The housing 2 includes a box 4 of a rectangular parallelepiped shape and a lid 5 covering an opening 4a of the box 4.

Figure 3:
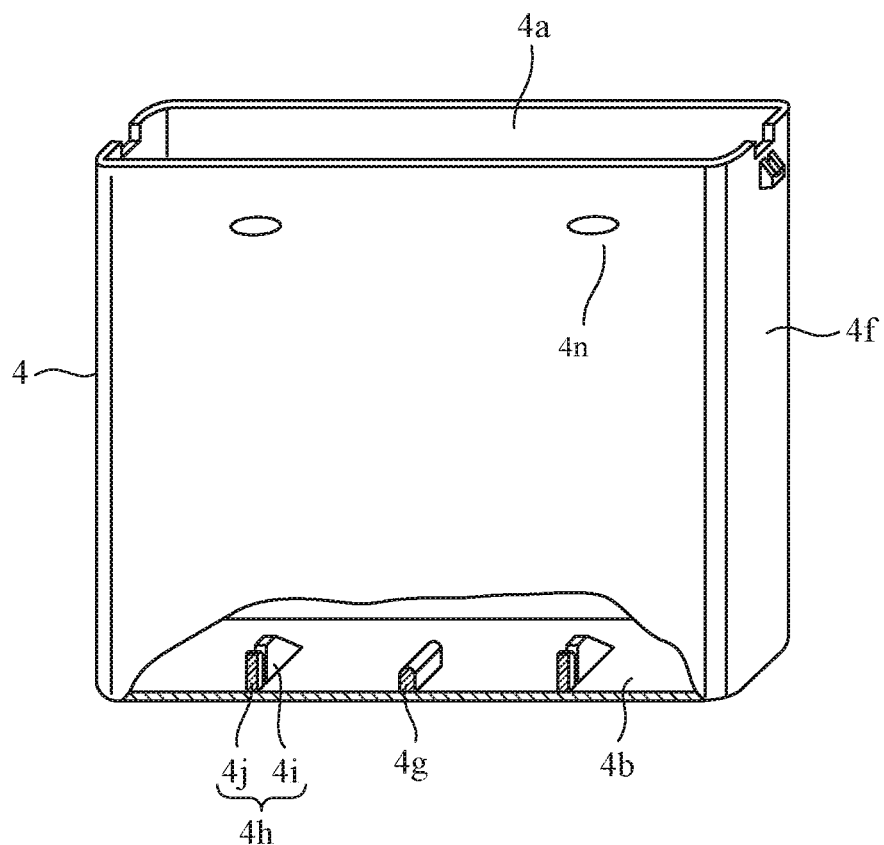
FIG. 3 is a perspective view of a main part illustrating the interior of a box of the vehicle-mounted electronic device according to the first embodiment.

FIG. 3 is a perspective view of a main part illustrating the interior of the box 4 of the vehicle-mounted electronic device 1 according to the first embodiment. In FIG. 3, illustration of a part of a bottom surface and a part of a side surface of the housing 2 described later is omitted.

Figure 4:
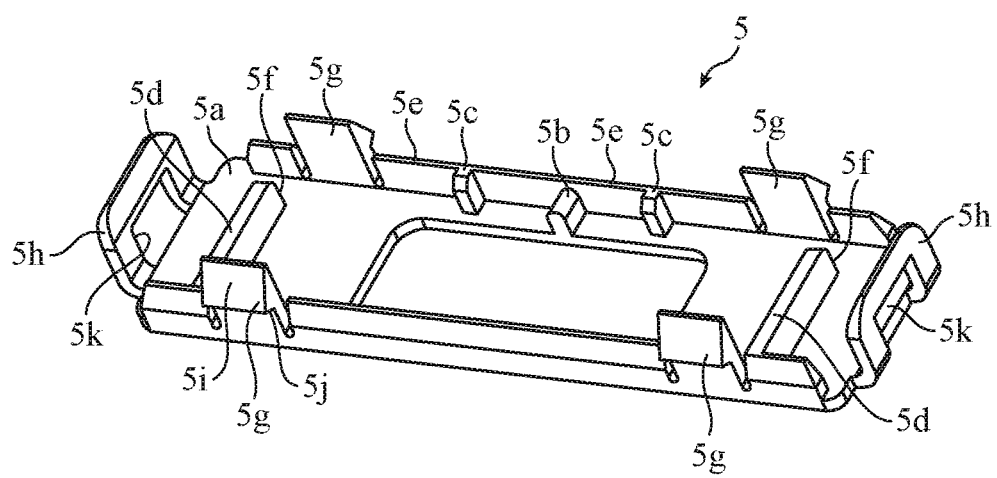
FIG. 4 is a perspective view of a lid of the vehicle-mounted electronic device according to the first embodiment.

FIG. 4 is a perspective view of the lid 5 of the vehicle-mounted electronic device 1 according to the first embodiment.

Details of the substrate 3, the box 4, and the lid 5 will be described with reference to FIGS. 1 to 4.

The substrate 3 includes a first notch 3a and a second notch 3b at the respective centers in the longitudinal direction of two sides perpendicular to an insertion direction X of the substrate 3 into the box 4. It is not necessary to form the first notch 3a and the second notch 3b precisely at the central position, and it is sufficient that the first notch 3a and the second notch 3b are included near the center.

The first notch 3a is fitted to a first protrusion 4g, which will be described later, provided inside the box 4. Furthermore, the second notch 3b is fitted to a second protrusion 5b, which will be described later, provided inside the lid 5. With the first notch 3a and the second notch 3b fitted into the first protrusion 4g and the second protrusion 5b, respectively, the substrate 3 is positioned inside the box 4.

The box 4 includes the opening 4a, a rear wall surface 4b, a top surface 4c, a bottom surface 4d, and side surfaces 4e and 4f.

The rear wall surface 4b faces a plane where the opening 4a is formed. The top surface 4c is parallel to a substrate surface of the substrate 3 inserted. The bottom surface 4d is parallel to the substrate surface of the substrate 3 and the top surface 4c. The side surfaces 4e and 4f are parallel to each other. The side surfaces 4e and 4f extend perpendicularly to the substrate surface of the substrate 3 inserted and extend in the insertion direction X. The first protrusion 4g fitted to the first notch 3a is provided upright at the center of the rear wall surface 4b on the inner side of the box 4. The first protrusion 4g has an outer shape that can be fitted into the first notch 3a, and the first protrusion 4g extends in the lateral direction of the rear wall surface 4b. On both sides of the first protrusion 4g, first ribs 4h are provided upright.

Each of the first ribs 4h has a plate-like first rib piece 4i and a second rib piece 4j that are provided upright and perpendicularly to the rear wall surface 4b. Between the first rib piece 4i and the second rib piece 4j, a gap into which the substrate 3 can be press-fitted is formed. When the substrate 3 is press-fitted into the gaps, the first rib pieces 4i are on one substrate surface of the substrate 3, and the second rib pieces 4j are on the other substrate surface of the substrate 3. The gaps between the first rib pieces 4i and the second rib pieces 4j are set to have a dimension smaller than the thickness of the substrate 3.

As illustrated in FIG. 2, the second rib pieces 4j are fixed to the rear wall surface 4b and the bottom surface 4d of the box 4. Meanwhile, the first rib pieces 4i are fixed only to the rear wall surface 4b of the box 4 and are not fixed to the top surface 4c.

If the first rib pieces 4i are fixed to the top surface 4c, when shrinkage occurs in the box 4 due to a temperature change, the first rib pieces 4i are deformed as the box 4 shrinks. Therefore, as illustrated in FIG. 2, by not fixing the first rib pieces 4i to the top surface 4c, deformation of the first rib pieces 4i generated by shrinkage of the box 4 is suppressed.

Alternatively to the example of FIG. 2, the second rib pieces 4j may be fixed only to the rear wall surface 4b without being fixed to the bottom surface 4d. It suffices that the first rib pieces 4i and the second rib pieces 4j are fixed to at least the rear wall surface 4b.

On each of the inner surfaces of the side surfaces 4e and 4f of the box 4, a first support member 4k for supporting the substrate 3 to be inserted is provided. As illustrated in FIG. 2, the height from the bottom surface 4d of the first support member 4k is equal to the height from the bottom surface 4d of the second rib piece 4j.

The substrate 3 is inserted in the insertion direction X while supported by the first support members 4k. When the substrate 3 is inserted into the box 4 deeper, the front end of the substrate 3 comes into contact with the first protrusion 4g of the box 4, and the first protrusion 4g guides the first notch 3a of the substrate 3 to be fitted to the first protrusion 4g, thereby positioning the substrate 3. When the first notch 3a is inserted further deeper into the first protrusion 4g, the front end of the substrate 3 is press-fitted into the gaps between the first rib pieces 4i and the second rib pieces 4j. Once the end of the first protrusion 4g comes into contact with the inner wall of the first notch 3a and the first notch 3a and the first protrusion 4g are completely fitted, the substrate 3 does not move in the insertion direction X.

FIG. 5 is a diagram illustrating the relation between the front end of the substrate 3 and the rear wall surface 4b of the box 4 of the vehicle-mounted electronic device 1 according to the first embodiment.

Figure 5A:
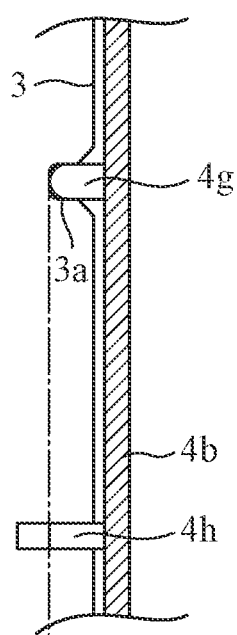
FIGS. 5A and 5B are diagrams illustrating a relation between a substrate and the box of the vehicle-mounted electronic device according to the first embodiment.

FIG. 5A is a diagram illustrating the relation between the substrate 3 and the rear wall surface 4b when the substrate 3 is completely inserted in the insertion direction X.

Figure 5B:
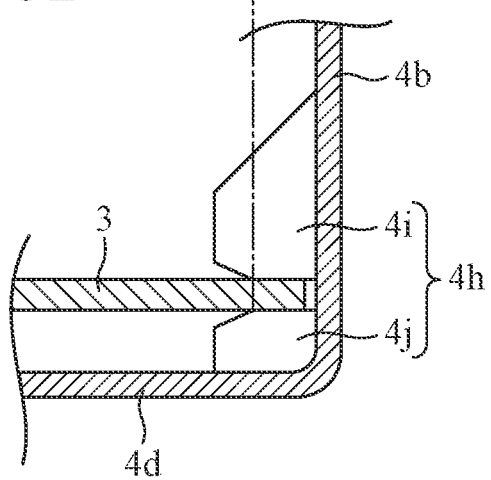

FIG. 5B is a diagram illustrating the relation among the substrate 3 and the first rib piece 4i and the second rib piece 4j when the substrate 3 is completely inserted in the insertion direction X.

As illustrated in FIG. 5A, in the state where the end of the first protrusion 4g of the box 4 abuts against the inner wall of the first notch 3a of the substrate 3 and the first notch 3a and the first protrusion 4g are completely fitted, the front end of the substrate 3 is provided so as not to abut against the rear wall surface 4b of the box 4. This is because, before the front end of the substrate 3 reaches the rear wall surface 4b of the box 4, the end of the first protrusion 4g of the box 4 abuts against the inner wall of the first notch 3a of the substrate 3 and thus the movement of the substrate 3 in the insertion direction X is restricted.

As illustrated in FIG. 5B, when the front end of the substrate 3 enters the gap between the first rib piece 4i and the second rib piece 4j, before the front end of the substrate 3 comes into contact with the rear wall surface 4b, the end of the first protrusion 4g of the box 4 abuts against the inner wall of the first notch 3a of the substrate 3. That is, the amount by which the substrate 3 is press-fitted into the gap between the first rib piece 4i and the second rib piece 4j is regulated by the depth of the first notch 3a and the amount by which the first protrusion 4g protrudes.

When the substrate 3 is completely inserted, the lid 5 is fixed to the box 4.

As illustrated in FIG. 1, the box 4 includes, as a structure for fixing the lid 5, an engaging protrusion 4m included on each of the side surfaces 4e and 4f and a total of four holes 4n, two of which formed on the top surface 4c of the box 4 and the other two of which formed on the bottom surface 4d of the box 4. Note that details of engagement between the box 4 and the lid 5 will be described later.

Next, the structure of the lid 5 will be described with reference to FIG. 4.

The lid 5 includes a lid surface 5a that covers the opening 4a of the box 4.

The lid surface 5a has, on the inner side thereof, the second protrusion 5b, a pair of second ribs 5c, and a pair of third ribs 5d as a structure for supporting the substrate 3 inserted into the box 4.

The second protrusion 5b is provided upright at the center in the longitudinal direction of the lid surface 5a. The second protrusion 5b is not necessarily provided strictly at the central position but may be provided near the center.

The second protrusion 5b has an outer shape that can be fitted into the second notch 3b of the substrate 3, and the second protrusion 5b extends in the lateral direction of the lid surface 5a.

The second ribs 5c are provided upright on both sides of the second protrusion 5b.

The third rib 5d is provided upright on the outer side of each of the second ribs 5c.

The substrate 3 inserted into the box 4 is positioned with respect to the lid 5 by the second notch 3b fitted to the second protrusion 5b. Moreover, one substrate surface of the substrate 3 is in contact with end surfaces 5e of the second ribs 5c, and the other substrate surface of the substrate 3 is in contact with end surfaces 5f of the third ribs 5d. As a result, the end of the substrate 3 is supported in such a manner as to be sandwiched between the second ribs 5c and the third ribs 5d, thereby supporting the substrate 3 without rattling.

The lid 5 includes four hooks 5g and two regulating parts 5h as a structure to be fixed to the box 4. Each of the hooks 5g is fitted into a corresponding hole 4n, and each of the regulating parts 5h is engaged with a corresponding engaging protrusion 4m, thereby fixing the lid 5 to the box 4 by the hooks 5g. Note that the number of the hooks 5g and the regulating parts 5h may be set as appropriate depending on the size and the shape of the box 4 and the lid 5.

In the example of FIG. 4, two hooks 5g are provided upright on each of the two longitudinal sides of the outer periphery of the lid surface 5a. Moreover, the four hooks 5g are provided upright at positions that allow tip portions of the hooks 5g to be inserted into the respective holes 4n formed at two places on the top surface 4c and two places on the bottom surface 4d of the box 4 when the lid 5 is fixed to the box 4.

The hooks 5g has flexibility. While the hooks 5g are deflected toward the inside of the box 4, the tip portions thereof are inserted into the respective holes 4n. As illustrated in FIGS. 2 and 4, the tip portion of each of the hooks 5g is formed with a guiding surface 5i for guiding the corresponding hook 5g to be inserted inside the box 4 and an inclined surface 5j for allowing the lid 5 to move by a specified amount in a direction opposite to the insertion direction X of the substrate 3, or specifically in a direction in which the lid comes off from the box 4, after the insertion.

In the example of FIG. 4, one regulating part 5h is provided upright on each of the two sides in the lateral direction of the outer periphery of the lid surface 5a. In addition, the regulating parts 5h are provided upright at positions that allow open areas 5k thereof to be engaged with the engaging protrusions 4m, one of which is provided on the side surface 4e of the box 4 and the other of which is provided on the side surface 4f of the box 4, when the lid 5 is fixed to the box 4.

Figure 6:
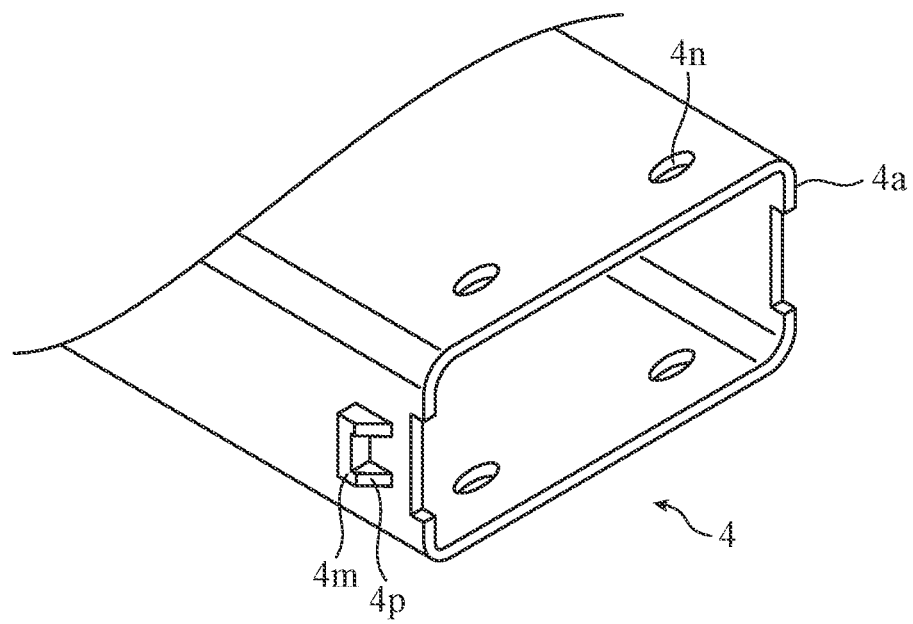
FIG. 6 is a diagram illustrating an engaging protrusion of the vehicle-mounted electronic device according to the first embodiment.

FIG. 6 is a diagram illustrating details of the engaging protrusion 4m of the vehicle-mounted electronic device 1 according to the first embodiment.

The engaging protrusion 4m is formed with a guiding surface 4p for guiding movement of the regulating part 5h. The regulating part 5h has flexibility and advances while deflected toward the outside of the box 4 while abutting against the guiding surface 4p. When the regulating part 5h goes across the engaging protrusion 4m, the open area 5k of the regulating part 5h is engaged with the engaging protrusion 4m. Clearances are provided between the open areas 5k of the regulating parts 5h and the engaging protrusions 4m with which the open areas 5k are engaged, and by these clearances, the maximum movement amount of the lid 5 to move in the direction opposite to the insertion direction X of the substrate 3 is regulated.

Figure 7:
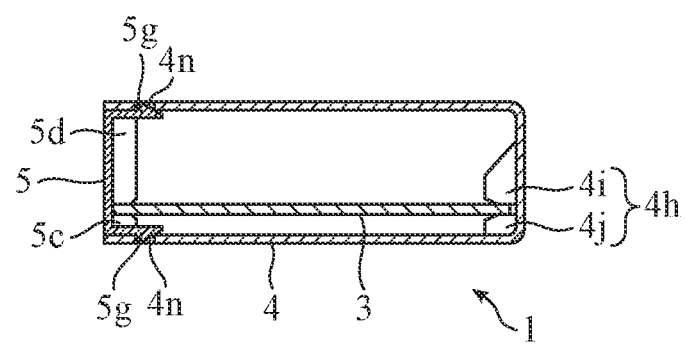
FIG. 7 is a side cross-sectional view of the assembled vehicle-mounted electronic device according to the first embodiment.

FIG. 7 is a side cross-sectional view illustrating a state in which the substrate 3 is inserted into the box 4 and the lid 5 is fixed to the box 4 in the vehicle-mounted electronic device 1 according to the first embodiment.

As illustrated in FIG. 7, the substrate 3 in the box 4 is supported by the first ribs 4h of the box 4 and the second ribs 5c and the third ribs 5d of the lid 5.

Furthermore, the lid 5 is fixed to the box 4 with the hooks 5g fitted into the respective holes 4n of the box 4.

Next, with reference to FIG. 8, description will be given on the case where shrinkage due to a temperature change occurs in the box 4 and the lid 5 in the state where the lid 5 is fixed to the box 4 as illustrated in FIG. 7.

Figure 8A:
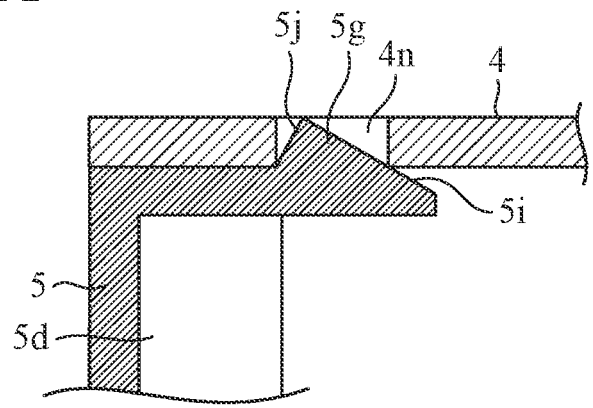
FIGS. 8A and 8B are diagrams illustrating a relation between a hook and a hole of the vehicle-mounted electronic device according to the first embodiment.
Figure 8B:
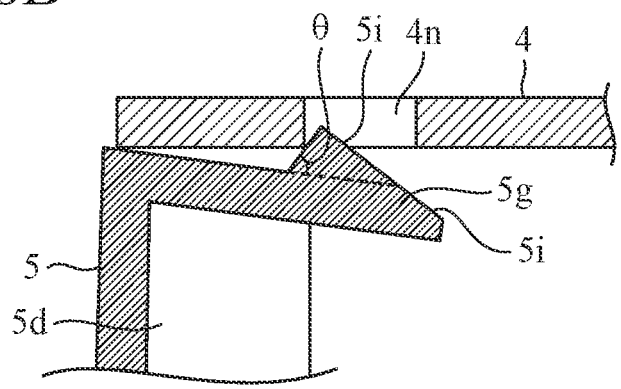

FIG. 8 is a diagram illustrating a relation between the hook 5g and the hole 4n of the vehicle-mounted electronic device 1 according to the first embodiment. FIG. 8A is a diagram illustrating the case where no shrinkage due to a temperature change is occurring in the box 4 or the lid 5, and FIG. 8B is a diagram illustrating the case where shrinkage due to a temperature change is occurring.

In the case where no shrinkage due to a temperature change is occurring in the box 4 or the lid 5, as illustrate in FIG. 8A, the hook 5g is not deflected toward the inside of the box 4, and a rising portion of the inclined surface 5j is disposed so as to abut against an opening edge of the hole 4n of the box 4. That is, in the state of FIG. 8A, the opening edge of the hole 4n does not get on the inclined surface 5j.

Meanwhile, even in the case where shrinkage due to a temperature change occurs in the box 4 and the lid 5, shrinkage due to the temperature change does not occur in the substrate 3 or the shrinkage factor in the substrate 3 is low. Therefore, the substrate 3 works in such a manner as to push back the force of the box 4 and the lid 5 trying to shrink. Therefore, as illustrated in FIG. 8B, the hook 5g is deflected toward the inside of the box 4, and the opening edge of the hole 4n gets on the inclined surface 5j.

However, an inclination angle θ of the inclined surface 5j is set so that the opening edge of the hole 4n does not go across the inclined surface 5j even in the case where the maximum force is applied to the box 4 and the lid 5 in a shrinking direction thereof and the maximum movement amount occurs by which the lid 5 is assumed to be moved in the direction opposite to the insertion direction X of the substrate 3 with respect to the box 4. In other words, the inclination angle θ, which allows for the maximum movement amount assumed for the movement in the direction opposite to the insertion direction X of the substrate 3, is set. The inclination angle θ may be set in further consideration of the condition that prevents the opening edge of the hole 4n from going across the inclined surface 5j when impact is externally applied to the box 4 and the lid 5.

It is desirable that as the inclination angle θ of the inclined surface 5j, for example an angle within the range of 50 degrees to 80 degrees be employed. Setting the inclination angle θ of the inclined surface 5j to a value within the above range allows the lid 5 to move by a specified amount in the direction opposite to the insertion direction X of the substrate 3 with respect to the box 4 and prevents the hooks 5g from coming off from the holes 4n.

Note that the above-described inclination angle θ is an example and is not limited to the above range, but may be set on the basis of the size of the inclined surfaces 5j of the hooks 5g, the clearances between the open areas 5k of the regulating parts 5h and the engaging protrusions 4m, a difference in the shrinkage factor between the housing 2 and the substrate 3 upon a temperature change, a temperature range in which the vehicle-mounted electronic device 1 is assumed to be used, etc.

Figure 9:
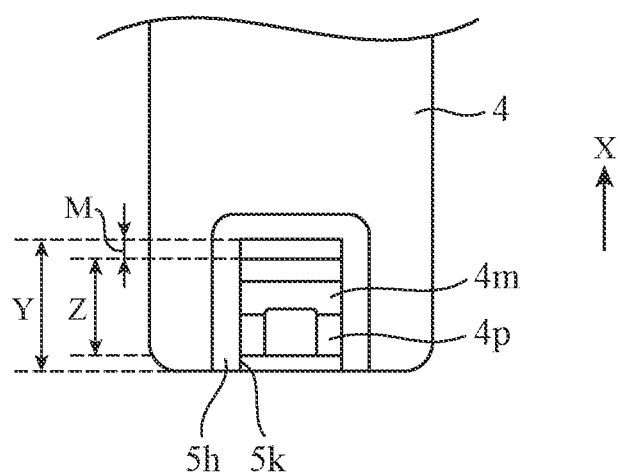
FIG. 9 is a diagram illustrating a relation between a regulating part and the engaging protrusion of the vehicle-mounted electronic device according to the first embodiment.

FIG. 9 is a diagram illustrating a relation between the regulating part 5h and the engaging protrusion 4m of the vehicle-mounted electronic device 1 according to the first embodiment.

When a length Y of an inner side of the open area 5k of the regulating part 5h is compared with a length Z of an outer side of the engaging protrusion 4m in the state where the lid 5 is fixed to the box 4, the length Y of the open area 5k is longer. The lengths Y and Z are those in the insertion direction X of the substrate 3. That is, the open area 5k of the regulating part 5h has a clearance in the insertion direction X of the substrate 3 with respect to the engaging protrusion 4m. The clearance allows the lid 5 to move by a small amount in the direction opposite to the insertion direction X of the substrate 3 with respect to the box 4 with the engaging protrusion 4m engaged in the open area 5k.

Furthermore, a clearance amount M illustrated in FIG. 9 is set on the basis of the maximum movement amount by which the lid 5 is assumed to be moved in the direction opposite to the insertion direction X of the substrate 3 with respect to the box 4 in the state where the lid 5 is fixed to the box 4. This maximum movement amount is determined within a range in which the opening edge of the hole 4n described above does not go across the inclined surface 5j of the lid 5.

As described above, in the vehicle-mounted electronic device 1 according to the first embodiment, the fitting of the first notch 3a of the substrate 3 into the first protrusion 4g of the box 4, the fitting of the second notch 3b of the substrate 3 into the second protrusion 5b of the lid 5, the first ribs 4h sandwiching and supporting the substrate 3, and the second ribs 5c and the third ribs 5d sandwiching and supporting the substrate 3 enable suppression of rattling in the direction perpendicular to the insertion direction X of the substrate 3 as well as provision of clearances for absorbing a difference in the shrinkage amount in the direction perpendicular to the insertion direction X between the substrate 3 and the housing 2 upon a temperature change.

Moreover, the fitting between the holes 4n of the box 4 and the hooks 5g, the abutment between the opening edges of the holes 4n and the inclined surfaces 5j of the hooks 5g, the engagement between the open areas 5k of the regulating parts 5h and the engaging protrusions 4m, and the clearances between the open areas 5k and the engaging protrusions 4m enable provision of clearances for absorbing a difference in the shrinkage amount in the direction X between the substrate 3 and the housing 2 upon a temperature change.

In addition, due to the flexibility of the hooks 5g and the regulating parts 5h, rattling in the insertion direction X of the substrate 3 can be suppressed.

As described above, according to the first embodiment, the substrate 3 has the first notch 3a and the second notch 3b at the respective centers of the two sides facing each other. In addition, the housing 2 includes the box 4 having the opening 4a and the lid 5 covering the opening 4a. In addition, the box 4 has, on the rear wall surface 4b facing the plane where the opening 4a is formed, the first protrusion 4g which is fitted to the first notch 3a and first ribs 4h which support a first end of the substrate 3 by sandwiching the first end, and further has, on the two surfaces facing respective substrate surfaces of the substrate 3, the hole 4n for each of the two surfaces. In addition, the lid 5 has, on the lid surface 5a facing the opening 4a, the second protrusion 5b fitted to the second notch 3b, the second rib 5c, and the third rib 5d, the second and third ribs 5c and 5d supporting a second end of the substrate 3 by sandwiching the second end, and has, at the outer periphery of the lid 5, the hooks 5g each of which fixes the lid 5 to the box 4 by being fitted to the corresponding hole 4n of the box 4. In addition, the hooks 5g each have the inclined surface 5j that allows the lid 5 to move by a specified amount in the direction in which the lid 5 comes off from the box 4.

Therefore, even in the case where linear expansion coefficients of the substrate and the housing are different, a difference in the shrinkage factor between the substrate and the housing upon a temperature change can be absorbed in the insertion direction X of the substrate and in the direction perpendicular to the insertion direction X. This can suppress occurrence of a crack in the housing due to a temperature change and prevent a member such as the lid from coming off from the housing.

In addition, the fitting of the first notch 3a into the first protrusion 4g and the fitting of the second notch 3b into the second protrusion 5b can suppress rattling between the substrate and the housing.

Moreover, according to the first embodiment, the lid 5 has, on the outer periphery thereof, the regulating part 5h formed with the open area 5k engaged with the engaging protrusion 4m provided to the box 4. In addition, the movement amount for the lid 5 to move in the direction in which the lid 5 comes off from the box 4 is regulated by the clearance between the open area 5k and the engaging protrusion 4m engaged with the open area 5k. Thus, a member such as the lid can be prevented from coming off from the housing.

Furthermore, according to the first embodiment, the hooks 5g have flexibility, and the opening edge of the hole 4n of the box 4 moves on the inclined surface 5j as the corresponding one of the hooks 5g is deflected toward the inside of the box 4. Thus, the lid is allowed to move in the direction opposite to the insertion direction of the substrate. Therefore, even in the case where linear expansion coefficients of the substrate and the housing are different, a difference in the shrinkage factor between the substrate and the housing upon a temperature change can be absorbed in the insertion direction of the substrate. Furthermore, it is possible to suppress occurrence of a crack in the housing and prevent a member such as the lid from coming off from the housing.

Further, according to the first embodiment, the first ribs 4h each include the first rib piece 4i provided on one surface side of the substrate 3 and the second rib piece 4j provided on the other surface side of the substrate 3 that are fixed on at least the rear wall surface 4b of the box 4, and the substrate 3 is press-fitted into the gap between the first rib piece 4i and the second rib piece 4j. The press-fitted amount of the press-fitting is regulated by the fitting of the first notch 3a of the substrate 3 into the first protrusion 4g of the box 4. Therefore, a clearance which can prevent the substrate from coming into contact with the rear wall surface and can absorb a difference in the shrinkage factor between the substrate and the housing upon a temperature change can be included in the insertion direction of the substrate. That is, a difference in the shrinkage factor between the substrate and the housing upon a temperature change can be allowed in the insertion direction of the substrate. Thus, occurrence of a crack in the housing can be suppressed, and a member such as the lid can be prevented from coming off from the housing.

Incidentally, within the scope of the present invention, the present invention may include a modification of any component of the embodiment, or an omission of any component of the embodiment.

INDUSTRIAL APPLICABILITY

A vehicle-mounted electronic device according to the present invention and of the present invention is capable of suppressing rattling between a substrate and a housing made of materials having different linear expansion coefficients and is capable of preventing a difference in the shrinkage factor between the substrate and the housing upon a temperature change from causing a crack to occur in the housing or from causing a member such as the lid to come off from the housing. Thus, the vehicle-mounted electronic device can be used as an electronic device provided at a part where the temperature changes.

REFERENCE SIGNS LIST

1: Vehicle-mounted electronic device, 2: Housing, 3: Substrate, 3a: First notch, 3b: Second notch, 4: Box, 4a: Opening, 4b: Rear wall surface, 4c: Top surface, 4d: Bottom surface, 4e, 4f: Side surface, 4g: First protrusion, 4h: First rib, 4i: First rib piece, 4j: Second rib piece, 4k: Support member, 4m: Engaging protrusion, 4n: Hole, 5: Lid, 5a: Lid surface, 5b: Second protrusion, 5c: Second support member, 5d: Third support member, 5e, 5f: End surface, 5g: Hook, 5h: Regulating part, 5i: Guiding surface, 5j: Inclined surface, 5k: Open area

The invention claimed is:

1. A vehicle-mounted electronic device, comprising:
   a housing formed of a resin material; and
   a substrate formed of a material having a linear expansion coefficient smaller than that of the resin material, the substrate accommodated in the housing,
   wherein the substrate has a first notch and a second notch at respective centers of two sides of the substrate, the two notches facing each other,
   the housing includes a box having an opening and a lid covering the opening,
   the box has, on a rear wall surface facing a plane where the opening is formed, a first protrusion which is fitted to the first notch and first ribs which support a first end of the substrate by sandwiching the first end, and has, on two surfaces facing respective substrate surfaces of the substrate, a hole for each of the two surfaces,
   the lid has, on a lid surface facing the opening, a second protrusion fitted to the second notch, a second rib that supports one surface of the substrate at a second end of the substrate, and a third rib that supports an opposite surface of the substrate at the second end of the substrate, the second rib is provided offset from the third rib in a longitudinal direction of the lid, and has, at an outer periphery of the lid, hooks each of which fixes the lid to the box by being fitted to the corresponding hole of the box, and
   the hooks each have an inclined surface that allows the lid to move by a specified amount in a direction in which the lid comes off from the box.

2. The vehicle-mounted electronic device according to claim 1,
   wherein the lid has, on the outer periphery, a regulating part formed with an open area engaged with an engaging protrusion provided to the box, and
   a movement amount for the lid to move in the direction n which the lid comes off from the box is regulated by a clearance between the open area and the engaging protrusion engaged with the open area.

3. The vehicle-mounted electronic device according to claim 1,
   wherein the hooks have flexibility, and
   an opening edge of the hole of the box moves on the inclined surface as a corresponding one of the hooks is deflected toward an inside of the box.

4. The vehicle-mounted electronic device according to claim 1,
   wherein the first ribs each include a first rib piece provided on one surface side of the substrate and a second rib piece provided on another surface side of the substrate, the first rib piece and the second rib piece fixed on at least the rear wall surface of the box,
   the substrate is press-fitted into a gap between the first rib piece and the second rib piece, and
   a press-fitted amount of the press-fitting is regulated by fitting of the first notch of the substrate into the first protrusion of the box.

* * * * *